(12) United States Patent
Trimberger

(10) Patent No.: US 7,809,544 B1
(45) Date of Patent: Oct. 5, 2010

(54) METHODS OF DETECTING UNWANTED LOGIC IN DESIGNS FOR PROGRAMMABLE LOGIC DEVICES

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 724 days.

(21) Appl. No.: 11/818,239

(22) Filed: Jun. 13, 2007

(51) Int. Cl.
*G06F 17/50* (2006.01)
(52) U.S. Cl. .............................. 703/15; 703/14; 716/16
(58) Field of Classification Search ................... 703/14, 703/15; 716/16
See application file for complete search history.

(56) References Cited

U.S. PATENT DOCUMENTS

| | | | |
|---|---|---|---|
| 5,384,720 A | 1/1995 | Ku et al. | |
| 5,581,738 A * | 12/1996 | Dombrowski | 716/16 |
| 5,960,188 A | 9/1999 | Linke et al. | |
| 6,327,557 B1 | 12/2001 | Croix | |
| 6,721,914 B2 * | 4/2004 | Bartenstein et al. | 714/734 |
| 6,981,153 B1 * | 12/2005 | Pang et al. | 713/194 |
| 7,100,141 B1 * | 8/2006 | Ratchev et al. | 716/16 |
| 7,143,376 B1 * | 11/2006 | Eccles | 716/5 |
| 7,315,802 B1 * | 1/2008 | Jenkins, IV | 703/14 |
| 2002/0150252 A1 * | 10/2002 | Wong | 380/277 |
| 2005/0069128 A1 * | 3/2005 | Inoue et al. | 380/42 |
| 2005/0102125 A1 * | 5/2005 | Tseng | 703/14 |
| 2006/0052994 A1 * | 3/2006 | Takei | 703/14 |

OTHER PUBLICATIONS

Bossuet et al., Dynamically configurable security for SRAM FPGA bitstreams, Jul. 2006, International Journal of Embedded Systems 2006—vol. 2, No. 1/2 pp. 73-85.*
Geilbert et al.; "On the Efficiency of the Transition Fault Model for Delay Faults"; 1990 IEEE International Conference on Computer-Aided Design; Nov. 1990; pp. 272-275.
Bryant et al.; "Performance Evaluation of FMOSSIM, A Concurrent Switch-Level Fault Simulator"; IEEE; 22nd Conference on Design Automation; Jun. 1985; pp. 715-719.
Kubiak et al.; Rapid Integrated-Circuit Reliability-Simulation and its Application to Testing; IEEE Transactions on Reliability; vol. 41, No. 3; Sep. 1992; pp. 458-465.

(Continued)

*Primary Examiner*—Paul L Rodriguez
*Assistant Examiner*—Aniss Chad
(74) *Attorney, Agent, or Firm*—Lois D. Cartier; LeRoy D. Maunu

(57) ABSTRACT

Methods of detecting unwanted logic in a configuration bitstream for a programmable logic device (PLD). The bitstream can be reversed engineered to generate a model of the design. The model is then tested for unwanted logic, e.g., logic inserted for the purpose of monitoring or interfering with the desired functionality of the design, by applying a test suite that exercises all desired functions for the design. If some of the logic nodes in the model are not exercised by the test suite, then the unexercised nodes might constitute unwanted logic and might have been inserted for malicious purposes. To reverse engineer the bitstream, a simulation model of the unprogrammed PLD can be used. Configuration bits from the bitstream can be inserted into the model of the unprogrammed PLD. The modified model can be simplified by propagating constants through the model in response to the values inserted into the model.

11 Claims, 2 Drawing Sheets

OTHER PUBLICATIONS

Heinitz et al.; "Automatic Fault Diagnosis for Scan-Based Designs, Microelectronic Engineering"; vol. 31; Feb. 1996; pp. 331-338.

U.S. Appl. No. 10/430,588; by Jenkins; filed by Xilinx, Inc. on May 6, 2003.

Jin, Wei et al.; "FastSlim: Profetch-Safe Trace Reduction for I/O Cache Simulation"; ACM Transactions on Modeling and Computer Simulation; vol. II, No. 2; Apr. 2001; Copyright 2001; pp. 135-160.

Kaplan, Scott F. et al.; "Trace Reduction for Virtual Memory Simulations"; ACM SIGMETRICS Performance Evaluation Review, Proceeding of the 1999 ACM SIGMETRICS International Conference on Measurements and Modeling of the Computer Systems; May 1999; Copyright 1999 ACM; pp. 47-58.

McGeoch, Catherine; "Analyzing Algorithms by Simulation: Variance Reduction Techniques and Simulation Speedups"; ACM Computing Surveys; vol. 24, No. 2; Jun. 1992; Copyright 1992 ACM; pp. 195-212.

Kaplan, Scott F. et al.; "Flexible Reference Trace Reduction for VM Simulations"; ACM Transactions on Modeling and Computer Simulations; vol. 13, No. 1; Jan. 2003; Copyright 2003 ACM; pp. 1-38.

* cited by examiner

METHODS OF DETECTING UNWANTED LOGIC IN DESIGNS FOR PROGRAMMABLE LOGIC DEVICES

FIELD OF THE INVENTION

The invention relates to security methods in programmable logic devices (PLDs). More particularly, the invention relates to methods of detecting unwanted logic that may be inserted into a PLD design.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

For all of these PLDs, the functionality of the device is controlled by data bits (the "configuration bitstream") provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

PLD designs can include millions of logic gates, and therefore can be very complicated. Hence, a common method of designing for a PLD includes incorporating pre-developed logic blocks ("cores") into the design. A core can include a predetermined set of configuration bits that program the PLD to perform one or more functions. Alternatively, a core can include source code or schematics that describe the logic and connectivity of a design. Typical cores can provide, but are not limited to, digital signal processing (DSP) functions, memories, storage elements, and math functions. Some cores include an optimally floorplanned layout targeted to a specific family of PLDs. Cores can also be parameterizable, i.e., allowing the user to enter parameters to activate or change certain core functionality.

Developers of PLD applications are becoming increasingly reliant on outside core developers or "IP (intellectual property) providers" for components of their systems. In some sensitive applications, developers may be concerned that an IP provider could include in a core additional logic designed to monitor or even interfere with the functionality of the design. To provide one simple example, a PLD design used in a ATM (automatic teller machine) system could include in one of its cores "Trojan horse" logic that allows a specific cardholder to withdraw cash from an account without reporting the transaction to the bank.

Therefore, it is desirable to provide methods by which PLD designers can confirm that no such unwanted logic has been inserted into their designs.

SUMMARY

The invention provides methods of detecting unwanted logic that may be inserted into a configuration bitstream for a programmable logic device (PLD). The configuration bitstream can be reversed engineered to generate a model (e.g., a simulation model) of the design. The model is then tested for unwanted logic, such as logic inserted for the purpose of monitoring or interfering with the desired functionality of the design, by applying a test suite that exercises all desired functions for the design. If some of the logic nodes in the model are not exercised by the test suite, then the unexercised nodes might constitute unwanted logic and might have been inserted for malicious purposes. The unexercised logic can then be removed from the design. If desired, the user can first review a list of the unexercised nodes to verify that the unexercised nodes constitute unwanted logic and do not reflect, for example, inadequacies in the test suite.

To reverse engineer the configuration bitstream, a simulation model of the PLD without programming (i.e., prior to configuration or programming) can be used. Configuration bits from the configuration bitstream can be inserted into the simulation model of the unprogrammed PLD, such that the modified simulation model mimics the behavior of the PLD as programmed with the configuration bitstream. In some embodiments, the modified model is then simplified, without impacting the logical behavior of the model, by propagating constants through the model in response to the values inserted into the simulation model.

BRIEF DESCRIPTION OF THE DRAWINGS

The present invention is illustrated by way of example, and not by way of limitation, in the following figures.

DETAILED DESCRIPTION OF THE DRAWINGS

Figure 1:
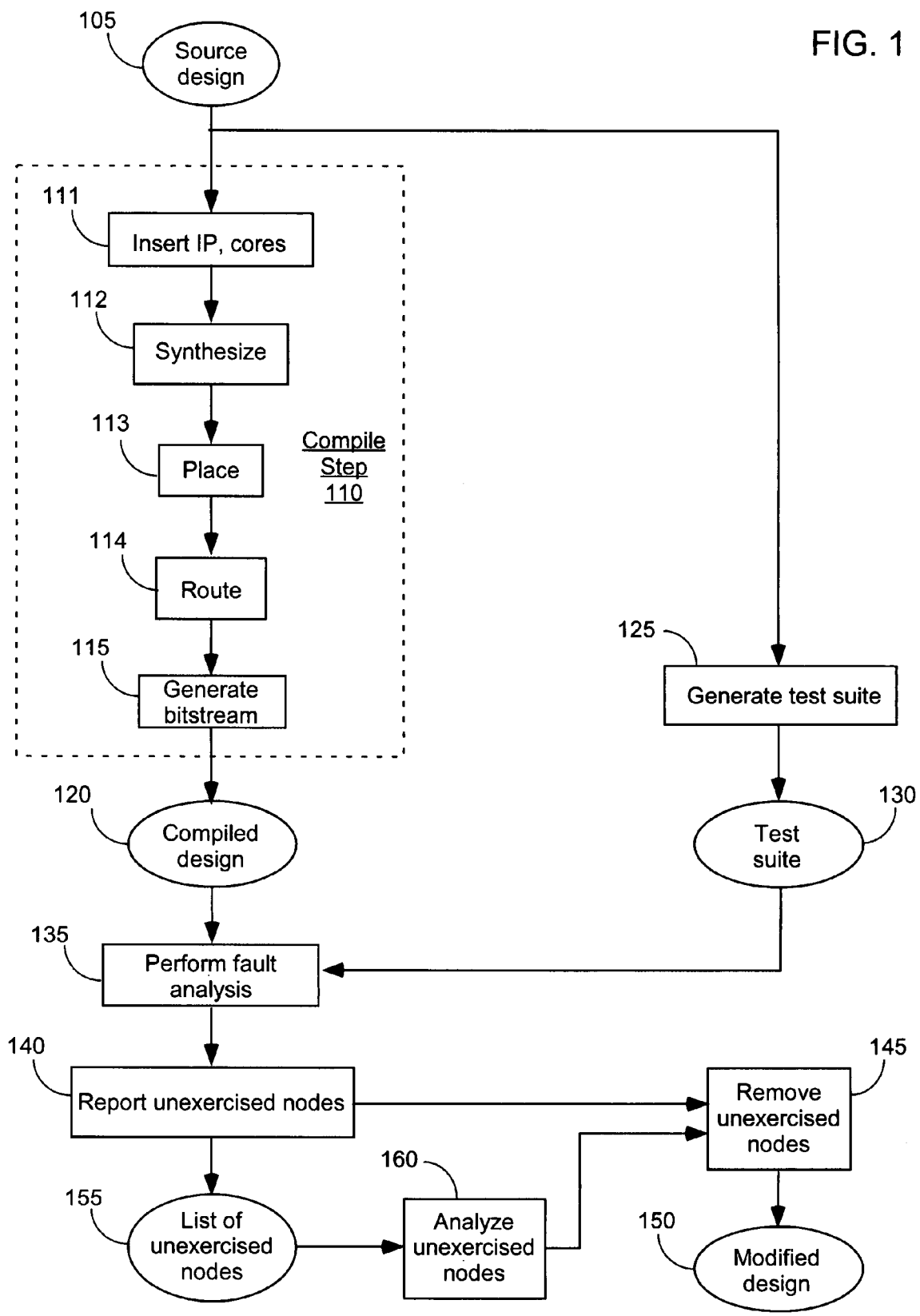
FIG. 1 illustrates the steps of a method of detecting unwanted logic in a design for a PLD, according to one embodiment of the present invention.

The present invention is applicable to a variety of types of programmable logic devices (PLDs). The present invention has been found to be particularly applicable and beneficial for field programmable gate arrays (FPGAs). Therefore, an appreciation of the present invention is presented by way of specific examples utilizing FPGAs. However, the invention is not so limited.

As previously described, in some applications it can be important to ensure that no functionality has been inserted into a PLD design that can, for example, monitor and/or undesirably influence the behavior of the design. Therefore, it is desirable to provide methods by which the designer of a PLD design can confirm that no unwanted logic has been inserted into the code for the design (e.g., in cores or other IP inserted into the design), or added by the design compiler software.

One method of verifying the absence of unwanted logic might be to do a direct or indirect comparison between the original design and a later version of the design. A direct comparison might be, for example, a line-by-line automatic or manual comparison of the two designs in a similar format (e.g., compiled netlist format). An indirect comparison might be a comparison of the original and later designs in two dissimilar formats, such as comparing HDL code or compiled code for a PLD design to a configuration bitstream implementing the design in the PLD. This process is potentially time-consuming and tedious, although (ignoring the possibility of human error) it could be quite accurate in detecting unwanted alterations in the logic.

The present invention provides another approach that may be faster, less tedious, and potentially equally accurate. Preferably, the methods of the invention build on work typically already done for a design, by taking advantage of an existing test suite for the PLD design.

Test suites as currently known are used to test the functionality of a design. A test suite is typically prepared that exercises all desired functions of a design, thereby verifying that the design performs as planned.

The present invention illustrates another application of such a test suite. The test suite was built to exercise known logic. Therefore, any logic not exercised by the test suite is unwanted, and may even have been inserted for a malicious purpose. By applying the test suite to the logic and performing a fault analysis of the results, a list can be generated of all logic not exercised by the test suite. This list may be, for example, a complete listing of the nodes not exercised, or a list of indicators showing line numbers or some other identifiers of the unexercised nodes. In some embodiments, the list may be output to another computer program and can be used, for example, to automatically remove the unwanted logic or code from the design. In other embodiments, the list is provided to the user, who can analyze each unexercised node and verify that it constitutes unwanted logic or code prior to the removal of the logic or code.

FIG. 1 illustrates the steps of a method of detecting unwanted logic in a design for a PLD, according to an embodiment of the present invention. A source design 105 is provided and can be in any form, such as, for example, HDL code, C code, a design netlist, and so forth. (A "design netlist" is a description of a design comprising a list of circuit elements (e.g., logic gates) and the connections (nets or nodes) between the outputs and inputs of the circuit elements.) In step 110, the design is compiled to produce a compiled design 120, which in the pictured embodiment comprises a configuration bitstream implementing the source design in the target PLD.

As is well known, compilation of a PLD design can include, for example, the insertion 111 of previously developed portions of the design, such as intellectual property (IP) cores from third party vendors or parameterizable cores provided by the PLD vendor. In step 112, the full design may be synthesized, e.g., by a commercially available synthesis tool such as are well known in the art. In steps 113 and 114, the design is placed and routed to implement the design in the target PLD. In step 115, a configuration bitstream is generated implementing the source design 105 in the target PLD. The result is the compiled design 120. The illustrated steps illustrate a compilation step 110 that can be applied, for example, to some FPGAs. However, the detailed steps shown in FIG. 1 are purely exemplary, and in other embodiments a different series of steps may be taken to generate the compiled design.

In the pictured embodiment, a test suite 130 is generated (step 125) that verifies all desired functionality for the design. In step 135, a fault analysis is performed on the test suite as applied to the compiled design to detect unexercised nodes, an "unexercised node" being a node in the compiled design that does not change value during application of the test suite to the compiled design. One well known and commercially available tool that can be used to perform a fault analysis is a "fault grader".

A fault grader typically checks to make sure that all nodes are driven to both high and low values during the application of a test suite to the design, and that the result of the drive is visible at one or more outputs of the design. Thus, a fault grader checks for nodes that are not fully exercised by the test suite. However, in the present application, it is only necessary to identify any nodes in the design that do not change state during the application of the test suite, to identify unwanted logic in the design. Such nodes are referred to herein as "unexercised nodes".

Note that the steps of generating a test suite and performing a fault analysis act to perform a comparison between the behavior of the model of the design and the behavior of the design, e.g., the desired functionality of the design. Other embodiments can use other methods of performing this comparison, if desired. For example, the comparison can be made by formal verification techniques. One such method is a network matching tool, typically used to compare the equivalence of an extracted netlist with a design netlist. One such tool is the Assura LVS tool available from Cadence Design Systems.

In step 140, the unexercised nodes detected during the fault analysis 135 are reported. For example, the unexercised nodes can be reported to another computer program (or another portion of the same computer program) which removes the unexercised nodes from the design (step 145). Since the nodes did not change value during the application of the test suite, removing the nodes will not alter the functionality of the design. For example, a node "stuck at" a high value can be removed and replaced by a simple connection to power high VCC, and a node stuck at ground can removed and replaced by a ground connection. The result of this removal process is a modified design 150, which is free of unwanted logic.

In some embodiments, e.g., when the test suite has not been completely verified, it is possible that an unexercised node is the result of an incomplete test suite rather than unwanted logic in the design. Therefore, additionally or alternatively, the user may wish to pursue the presence of the unwanted logic more closely to determine its source. Therefore, optionally, a list 155 of the unexercised nodes can be provided to the user for further analysis and verification (step 160) prior to removing the unexercised nodes in step 145.

Note that unwanted logic could be inserted into the design at various stages in this process. For example, the IP/cores inserted in step 111 may be potential sources of unwanted logic. However, the synthesizer from step 112, the software that performs the place-and-route process at steps 113-114, and the bitstream generation software that performs step 115 also have the opportunity to insert undesirable logic into the design. Further, unwanted logic may inserted into the source design before compilation but after generation of the test suite, or into the compiled design after generation of the configuration bitstream. Unwanted logic inserted under any of these circumstances will be detected and removed when the illustrated method is applied.

Figure 2:
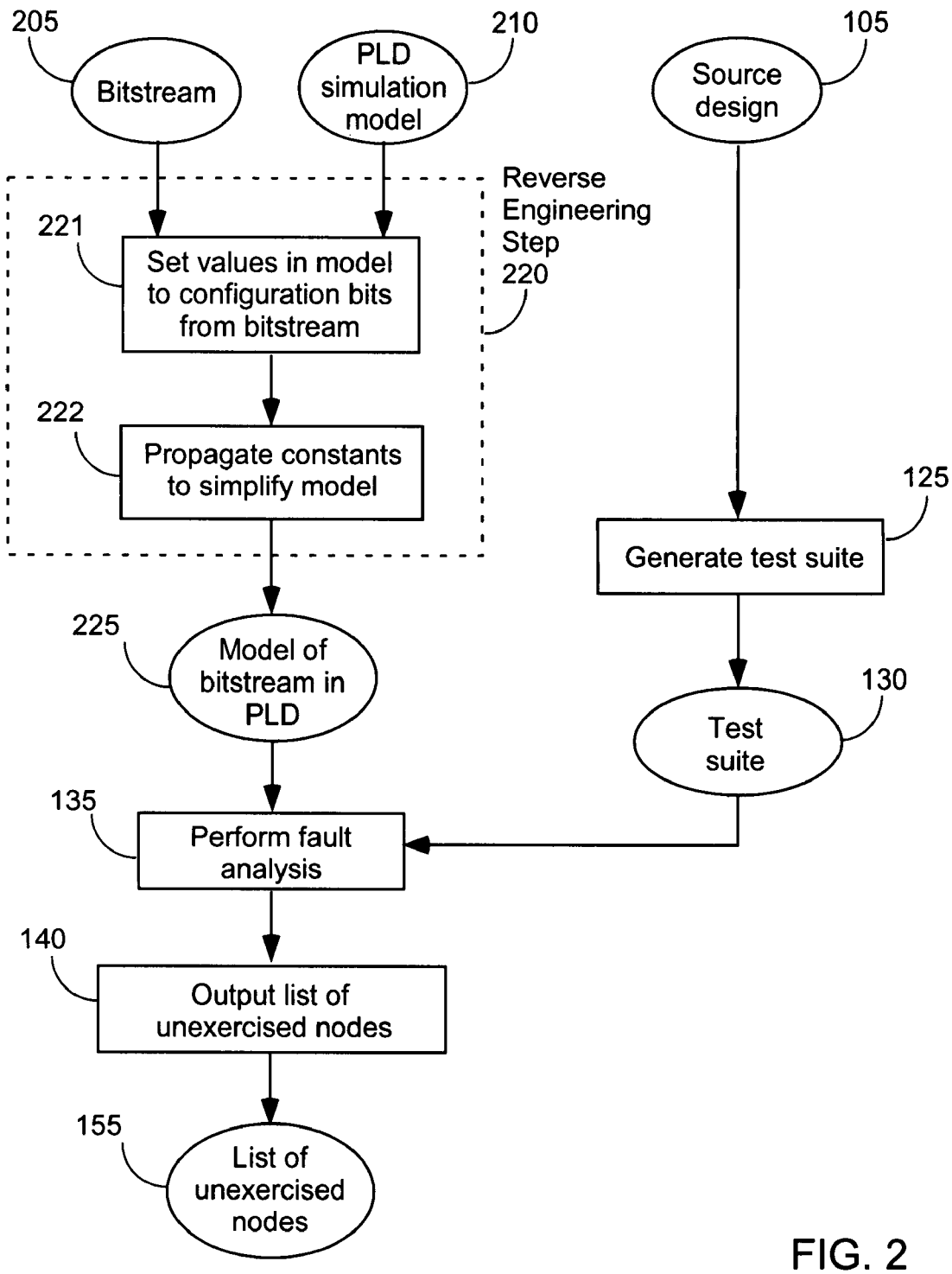
FIG. 2 illustrates the steps of a method of detecting unwanted logic in a configuration bitstream for a PLD, according to another embodiment of the present invention.

FIG. 2 illustrates the steps of a method of detecting unwanted logic in a configuration bitstream for a PLD, according to an embodiment of the present invention. The method of FIG. 2 is similar in some respects to the method of FIG. 1. Similar steps are given the same reference numbers as the corresponding steps in FIG. 1, and these steps are not again described.

In the embodiment of FIG. 2, the fault analysis is performed on the actual bitstream that will be applied (or has already been applied, or is being applied) to the PLD. Therefore, the embodiment of FIG. 2 can detect tampering with the PLD design at any stage.

To perform the steps of this embodiment, a simulation model 210 of the unconfigured (unprogrammed) target PLD is utilized, as well as the configuration bitstream 205 to be tested for unwanted logic. A reverse engineering step 220 inputs the simulation model 210 and the configuration bitstream 205, and provides from these inputs a simulation model of the actual design as implemented by the bitstream in the target PLD. One way of accomplishing this goal, as shown in step 221, is to start with the simulation model 210 of the unprogrammed PLD, extract from the bitstream 205 configuration bits for the various programmable elements of the PLD, and insert the values of these configuration bits into the simulation model. This process results in a modified model: a simulation model for the target PLD when programmed with bitstream 205.

The modified model produced in step 221 may be very complicated. In fact, the original simulation model 210 and the modified model may each encompass many millions of transistors. The simulation of such a large and complicated model may take an undesirably long time and/or consume an impractical amount of computing resources. Thus, in optional step 222, the modified model (the model of the programmed PLD) is simplified by taking the values inserted from the configuration bitstream, and propagating these values through the modified model.

For example, an FPGA includes a large number of routing multiplexers controlled by configuration bits. Once the value controlling each of the routing multiplexers is known, the behavior of the multiplexers remains fixed, with only one of the many paths through each multiplexer being a viable path. Thus, a large number of gates and multiplexers may be removed from the circuit or simplified without changing the functionality of the circuit. A multiplexer with a fixed control value can be replaced by a wire connecting the one control output to the multiplexer output. An AND-gate with a "0" input value can be replaced with a constant "0" output value. An OR-gate with a "1" input value can be replaced with a constant "1" value. Any logic that is not connected to an output can be removed from the circuit. In some embodiments, those transistors and gates programmed to be "off" at all times are simply removed from the simulation model, along with logic driving only those nodes. This approach could potentially greatly improve the speed of the fault analysis (step 135) and simplify the separation of unwanted logic from logic in the FPGA base array.

Examples of how the invention can be applied have been provided herein. However, this invention can be embodied in other forms without departing from the spirit or essential attributes thereof. Accordingly, reference should be made to the following claims, rather than to the foregoing specification, as indicating the scope of the present invention.

What is claimed is:

1. A method of detecting unwanted logic in a configuration bitstream for a programmable integrated circuit (IC), the configuration bitstream implementing a design, the method comprising:

using a processor to perform steps including:

reverse engineering the configuration bitstream to generate a simulation model of the design as implemented by the configuration bitstream in the programmable IC;

generating a test suite for the design, the test suite comprising one or more tests that verify all desired functions for the design;

performing a fault analysis on the test suite as applied to the simulation model of the design to detect unexercised nodes in the design, an unexercised node being a node in the simulation model that does not change value during application of the test suite to the simulation model of the design; and outputting a list of the unexercised nodes.

2. The method of claim 1, further comprising:

compiling the design to generate the configuration bitstream.

3. The method of claim 2, wherein the unexercised nodes are inserted into the design during the compiling.

4. The method of claim 2, wherein the design comprises Hardware Description Language (HDL) code.

5. The method of claim 1, further comprising analyzing the list to verify that the unexercised nodes comprise unwanted logic.

6. The method of claim 1, wherein reverse engineering the configuration bitstream comprises:

inputting a simulation model of the programmable IC without programming; and setting values in the simulation model of the programmable IC to reflect associated configuration bits in the configuration bitstream, wherein a modified model is generated that models the programmable IC programmed with the configuration bitstream.

7. The method of claim 6, wherein:

reverse engineering the configuration bitstream further comprises propagating constants through the modified model in response to setting the values in the simulation model of the programmable IC, wherein a simplified model is generated; and performing the fault analysis on the test suite as applied to the model of the design comprises performing the fault analysis on the test suite as applied to the simplified model.

8. The method of claim 1, further comprising:

modifying the configuration bitstream to remove the unexercised nodes from the design.

9. A method of detecting unwanted logic in a configuration bitstream for a programmable integrated circuit (IC), the configuration bitstream implementing a design, the method comprising:

using a processor to perform steps including:
reverse engineering the configuration bitstream to generate a simulation model of the design as implemented by the configuration bitstream in the programmable IC;
comparing behavior of the simulation model of the design with behavior of the design to detect unexercised nodes in the design, an unexercised node being a node in the simulation model that does not change value during application of the test suite to the simulation model of the design; and
outputting a list of the unexercised nodes.

10. The method of claim 9, wherein the reverse engineering comprises:
inputting the configuration bitstream; inputting a simulation model of the programmable IC without programming; setting values in the simulation model of the programmable IC to reflect associated configuration bits in the configuration bitstream, wherein a modified model is generated; and
outputting the modified model, the modified model comprising the simulation model of the design as implemented by the configuration bitstream in the programmable IC.

11. The method of claim 10, further comprising simplifying the simulation model of the design prior to the outputting, the simplifying comprising propagating constants through the modified model in response to setting the values in the simulation model of the programmable IC.

* * * * *